United States Patent [19]

Nawata et al.

[11] 4,375,999

[45] Mar. 8, 1983

[54] METHOD OF MANUFACTURING A SEMICONDUCTOR DEVICE

[75] Inventors: Kazumasa Nawata, Kawasaki; Hirokazu Suzuki, Yamato, both of Japan

[73] Assignee: VLSI Technology Research Association, Tokyo, Japan

[21] Appl. No.: 234,198

[22] Filed: Feb. 13, 1981

[30] Foreign Application Priority Data

Feb. 18, 1980 [JP] Japan ................................ 55-18791

[51] Int. Cl.³ .................... H01L 21/223; H01L 21/225
[52] U.S. Cl. .................................. 148/187; 148/188; 148/189; 29/577 C; 29/571
[58] Field of Search ............... 148/1.5, 187, 188, 189; 29/569 R, 576 B, 577 C, 571

[56] References Cited

U.S. PATENT DOCUMENTS

| | | | |
|---|---|---|---|
| 3,793,094 | 2/1974 | Strack et al. | 148/190 X |
| 4,029,527 | 6/1977 | Glasl et al. | 148/188 X |
| 4,063,973 | 12/1977 | Kirita et al. | 148/188 |
| 4,074,304 | 2/1978 | Shiba | 148/187 X |
| 4,125,426 | 11/1978 | Inayoshi et al. | 148/188 X |
| 4,197,147 | 4/1980 | Bergmann et al. | 29/577 C |
| 4,224,088 | 9/1980 | Komatsu et al. | 148/188 |
| 4,305,760 | 12/1981 | Trudel | 148/1.5 |

FOREIGN PATENT DOCUMENTS 55-5861  2/1980  Japan .................................. 148/188

*Primary Examiner*—G. Ozaki
*Attorney, Agent, or Firm*—Staas & Halsey

[57] ABSTRACT

A method of manufacturing a semiconductor device for simultaneously forming a plurality of diffused regions of selectively different diffusion depths, comprises forming polycrystalline semiconductor layers of corresponding, selectively different depths on the semiconductor substrate surface provided with a diffusion mask having a plurality of diffusion windows. By the impurity diffusion into the substrate through the windows at the polycrystalline semiconductor layer interface with the substrate, a comparatively shallow diffused region and a comparatively deep diffused region are formed simultaneously by a single diffusion process, respectively, under the comparatively thick polycrystalline semiconductor layer and the comparatively thin polycrystalline semiconductor layer.

9 Claims, 5 Drawing Figures

METHOD OF MANUFACTURING A SEMICONDUCTOR DEVICE

BACKGROUND OF THE INVENTION

1. Field of the Invention

This invention relates to a method of manufacturing a semiconductor device, more specifically, to a method of simultaneously forming the diffusion areas thereof in different diffusion depths.

2. Description of the Prior Art

In general, a semiconductor integrated circuit (IC) comprises an input/output interface circuit for receiving an external signal and outputting a signal to external circuits and an internal circuit having other functions such as logical operations.

The input/output interface circuit and the internal circuit are respectively composed of various elements, such as a transitor; such a transistor, for example, and other elements of both the interface circuit and the internal circuit are generally formed simultaneously by the same manufacturing process.

However, a transistor which receives an input signal from the outside, i.e., an external source, often receives external noise, for example, an extremly high voltage, and therefore it is desired for such an element to have a withstand voltage, i.e., breakdown voltage (those terms being used synonymously throughout), higher than that of those elements employed only in the internal circuit so that it can be reliably prevented from breakdown due to such external noise.

In the case of some ICs, the input/output interface circuit often operates at a high voltage, for example, 5 V, while the internal circuit operates at a low voltage, for example, 2 V. In this case, it is required also for a transistor employed in the input/output interface circuit to have a withstand voltage higher than that of a transistor employed solely in the internal circuit.

Such requirement can be met, for example, in the case of a bipolar transistor by providing a large difference between the depth of its base region and that of its emitter region.

Therefore, a transistor having a withstand voltage higher than that of a transistor in the internal circuit can be obtained by, for example, making the emitter region of the transistor in the input interface shallower than that of a transistor employed in the internal circuit while keeping the depth of the base regions of such transistors the same.

An IC comprising transistors of different junction depths can be manufactured using a conventional diffusion method or ion implantation. If the diffusion method is employed, each of the emitter diffusion and the base diffusion is carried out twice. For this reason, the diffusion method introduces an increase in the steps of the manufacturing processes.

If the ion implantation method is employed, the junction depth can be differentiated in a single ion implantation process by using a mask of predetermined, different thicknesses. However, direct ion implantation on the semiconductor surface damages the crystal structure of the semiconductor material, thus increasing leakage current defects.

Japanese laid-open patent specification No. 54-154287 discloses a method of manufacturing an IC wherein predetermined impurities are implanted into the silicon semiconductor substrate by the ion implantation method through an insulating film having selectively different thicknesses, for example, a silicon oxide insulating film, and simultaneously the semiconductor regions of different resistance values and junction depths are formed. According to this method, an IC comprising transistors of different junction depths can be realized without increases in the manufacturing processes but, as mentioned above, an increase of the leakage current of the transistor can result. Damage to the crystalline structure of the substrate at the area where ions are implanted via the silicon oxide film is alleviated. However, since oxygen atoms in the silicon oxide film are released by the impact of the bombarding ions on, and moving through the silicon oxide film, a defect is created. Japanese laid-open patent specifications Nos. (51-123071, 51-147969) disclose a method where the impurity doped polycrystalline silicon layer is caused to have selectively different thicknesses whereby junctions of different depths are formed.

Moreover, Japanese laid-open patent specification No. (52-150962) discloses a method where a single crystalline thin film which has selectively different thicknesses and different etching characteristic, for example, $Ga0.7Al0.3A_s$ is formed on the semiconductor substrate, for example, GaAs; impurities for doping the substrate are introduced by the diffusion or the ion implantation methods through the thin film, and thereafter the thin film is removed by an etching method.

SUMMARY OF THE INVENTION

It is an object of the present invention to provide an improved method of manufacturing a semiconductor device wherein diffusion areas, or regions, of different diffusion depths can be formed simultaneously.

It is another object of the present invention to provide an improved method of manufacturing a semiconductor device wherein diffusion regions of predetermined diffusion depths can be formed without damage to the junction areas of the semiconductor device.

It is another object of the present invention to provide a method of manufacturing a semiconductor device wherein diffusion areas of different diffusion depths can be formed simultaneously by using an undoped polycrystalline silicon layer, and which method is not accompanied by difficult techniques to control the amount of impurity introduced.

It is a further object of the present invention to provide a method of manufacturing a semiconductor device wherein an impurity diffusion into a semiconductor substrate can be controlled to a desired depth by impurity diffusion through an undoped polycrystalline silicon layer having selectively different thicknesses.

It is still further object of the present invention to provide a method of manufacturing a semiconductor device wherein the sheet resistivity of the polycrystalline silicon layer can be lowered by diffusing impurities into the undoped polycrystalline silicon layer from its upper surfaces.

It is still another object of the present invention to provide a method of manufacturing a semiconductor device wherein damage to the diffusion junctions due to the alloying of the electrode conductor and semiconductor substrate material can be prevented by utilizing the polycrystalline silicon layer, which is used for the control of diffusion depth, as the base contact layer for the electrode wiring conductors.

According to the present invention, an insulator diffusion mask having a plurality of diffusion windows is provided on the semiconductor substrate surface. As the diffusion mask, ordinary silicon oxide or silicon nitride film can be used. In addition, this diffusion mask also works as an etch-stop in the selective etching of the polycrystalline semiconductor, which will be described later.

Each diffusion window is covered with the polycrystalline semiconductor material. The substrate surface is exposed only at the area where a particularly deep diffusion is required.

In a diffusion window through which a comparatively shallow diffusion area should be formed, a comparatively thick polycrystalline semiconductor layer is formed. On the other hand, in the diffusion window where comparatively deep diffusion area should be formed, a comparatively shallow polycrystalline semiconductor layer is formed. The selectively different thicknesses of the polycrystalline semiconductor layer mentioned above can be obtained by sequentially stacking the polycrystalline semiconductor layer by, for example, the lift-off method of by forming initially a thick polycrystalline semiconductor layer and then selectively making the predetermined area thin by an etching method.

A polycrystalline semiconductor layer can be formed by evaporation, sputtering or chemical vapor deposition (CVD) method, etc. Of these methods, the low pressure CVD method is most widely employed. Therefore, it is desirable to make thin, by means of the etching, the predetermined area of the highly homogeneous polycrystalline semiconductor layer provided initially by the low pressure CVD method. For this etching, a chemical etching can also be employed, but a reactive sputtering method is more desirable from the point of view of accuracy.

Selective oxidation using a silicon nitride mask, with subsequent removal of the oxide film, is also a desirable etching method, wherein generation of the oxide film can be well controlled. In some cases, there may be used the method where the anodic oxidation is partly performed and, subsequently, the oxide film is removed. After the polycrystalline semiconductor layer of selectively different thicknesses is obtained thereby, the impurity diffusion is performed. For the impurity diffusion, the well known gas diffusion, solid to solid diffusion or ion implantation method may be employed.

The impurity reaches the semiconductor substrate after passing through the polycrystalline semiconductor layer of selectively different film thicknesses. Therefore, the diffusion depth in the substrate is shallow at thick areas of the polycrystalline semiconductor layer or deep at thin areas.

In the case of ion implantation through the polycrystalline semiconductor layer, oxygen is not implanted in contrast to that which occurs when ion implantation is performed through the SiO$_2$ film and therefore comparatively less crystal defects are found.

The gas diffusion and solid to solid diffusion are the most desirable diffusion methods because these methods do not cause generation of crystal defects which can be caused by the ion implantation method and correspondingly result in less leakage (through a so-called pipe, of conductive channel) between the collector and emitter.

The method of the invention permits selectively changing the diffusion depth in manufacturing a bipolar IC, when it is required to selectively change the transistor emitter depth of a bipolar IC in accordance with a desired purpose. For example, in a large scale integrated circuit (LSI), the operating voltage of the input/output interface circuit is different from that of the internal circuit. Generally, since the interface circuit operates at a high voltage, a transistor having a comparatively shallow emitter region depth is formed as the input/output interface circuit in such a way as having a high breakdown voltage and a transistor having a comparatively deep emitter region depth is formed as the internal circuit in such a way as having a low breakdown voltage and a high current amplification factor.

On the other hand, in the case of junction breakdown type programmable read-only-memory even when it is a bipolar IC, the base region of the transistor of a memory cell must be formed comparatively thick as compared with that of transistors of the peripheral circuits, in order to maintain the breakdown voltage of unwritten memory cells. In this case, transistors of different base region depths can also be formed by adopting the present invention.

The method of changing the diffusion depth afforded by the present invention can be adopted for selectively changing the source and drain junctions of a MOS IC in accordance with a desired purpose. As explained previously, in the MOS LSI, the operating voltage of the input/output interface circuit is different from that of the internal circuit and in general the interface circuit is so designed that has a high breakdown voltage in order to withstand high voltage transients, or noise, while the internal circuit requires only high speed operation.

In order to meet such different requirements, the source-drain junction of the interface circuit transistor is formed deeply and thus the junction breakdown voltage is high. On the other hand, the internal circuit is required to have the junction as shallow as possible in view of making the junction area narrow. Therefore, a MOS transistor having the desired junction depth can be formed through the formation of a junction by the method, as mentioned previously, of leaving a comparatively thin polycrystalline semiconductor layer on the source and drain forming windows of the MOS transistor of the interface circuit, while a comparatively thick polycrystalline semiconductor layer remains on the source and drain forming windows of the MOS transistor of the internal circuit. A deep junction transistor has gradual bending of junction and a high junction withstand voltage, i.e., a transistor with a deep junction having a relatively large radius of curvature at the periphery of the junction, that peripheral junction gradually bending toward i.e., having a gradual change of slope or inclination as it approaches the substrate surface.

The polycrystalline semiconductor layer on the source and drain regions furthermore is used to provide electrode contacts for the source and drain regions.

Further details of the present invention will be readily understood by referring to the description of the preferred embodiment.

DETAILED DESCRIPTION OF THE PREFERRED EMBODIMENTS

FIG. 1 to FIG. 5 show the process steps of manufacturing an IC wherein the base depth of the transistors is the same but the emitter depths of the transistors are different, respectively, in the internal circuit and the input interface circuit.

Figure 1:
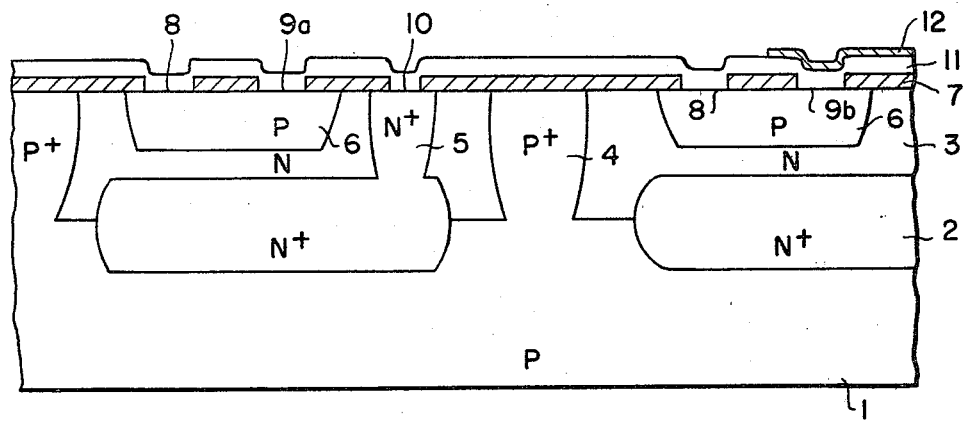
FIGS. 1 through 5 are partial cross-sectional views of an integrated circuit as formed in successive manufacturing steps, or stages according to the process of the present invention.

FIG. 1 is a partial cross-sectional view of a semiconductor wafer wherein an undoped polycrystalline silicon layer and a silicon nitride layer are coated on the surface of an ordinary bipolar IC. In the figure, the numeral 1 denotes the P type silicon substrate; 2 denotes an N+ type buried layer; and 3 denotes an N type silicon epitaxial layer having a specific resistance of 1Ωcm, as an example, and thickness of 2.5 μm. The reference number 4 denotes a P+ isolation diffusion layer; 5 denotes the collector contact diffusion layer which is in contact with the buried layer, and 6 denotes a base region which is formed by a single diffusion and has a sheet resistivity, as an example, of 500Ω/square and depth of 0.6 μm. The reference numeral 7 denotes the silicon oxide film covering the silicon substrate (1) surface. In the allocated areas of the oxide film 7, a base electrode window 8, an emitter electrode window 9 and a collector electrode window 10 are provided. The reference numeral 11 denotes an undoped polycrystalline silicon layer and its thickness is 2000 Å (200 nm); and 12 denotes a silicon nitride film of the thickness of 500 Å (50 nm).

A method of manufacturing a bipolar IC wherein all electrode windows are provided in a silicon oxide film, such as the film 7, and a polycrystalline silicon layer, such as layer 11, is used is explained in detail in the U.S. Pat. No. 4,125,426 assigned to the same assignee as the present invention.

Both the polycrystalline silicon layer 11 and the silicon nitride film 12 are formed by the chemical vapor deposition (CVD) method. The polycrystalline silicon layer 11 can be formed of uniform thickness by the decomposition of monosilane $SiH_4$ under reduced pressure. The apparatus for obtaining such a polycrystalline silicon layer is already available in the market. A particular doping material is not required for the growth of the polycrystalline silicon layer 11, but it is permissible for the polycrystalline silicon layer to have a low level conductivity as may occur from an unexpected migration of impurity materials into it.

Figure 2:
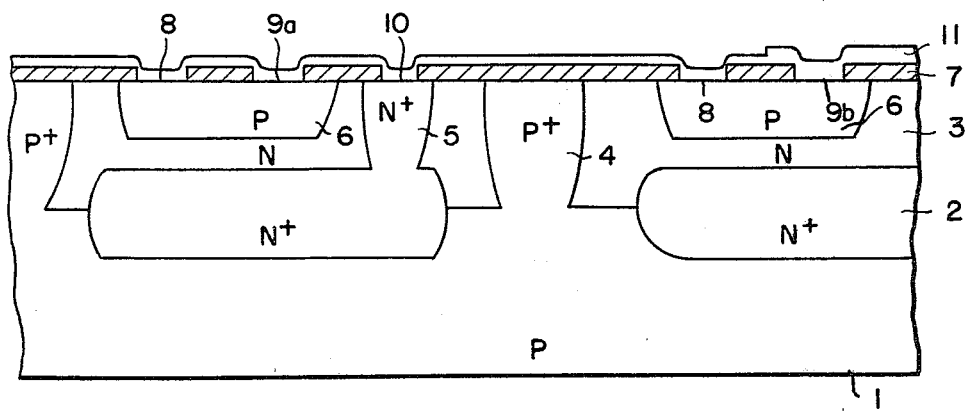

The polycrystalline silicon layer 11 is formed thin at the emitter window 9a where a comparatively deep emitter should be formed. Therefore, in the disclosed embodiment, the polycrystalline silicon layer 11 is first coated in a uniform thickness and thereafter it is thinned to a predetermined thickness at the emitter window 9a. For this purpose, the silicon nitride film 12 is left as shown in the figure. The selective etching of the silicon nitride film 12 can be carried out using the well known $SiO_2$ mask and hat phosphoric acid etching method. After this etching, the polycrystalline silicon layer 11 is selectively oxidized using the silicon nitride film 12 as the mask. Thermal oxidation is performed for 150 minutes by applying oxygen gas which has been passed over hot water of 100° C. and introduced into an electric furnace heated to 900° C.; the polycrystalline silicon layer 11 is oxidized from the surface to a controlled depth, producing a silicon oxide film of 2300 Å (230 nm) thickness. Thereafter, this oxide film is removed using a hydrofluoric acid etching solution and then the silicon nitride film 12 is removed. Thus that portion of polycrystalline silicon layer 11 which is not covered with the nitride film 12 and accordingly was selectively oxidized is reduced in thickness to 1000 Å (100 nm). FIG. 2 is a cross-sectional view of the semiconductor device thus obtained.

Figure 3:
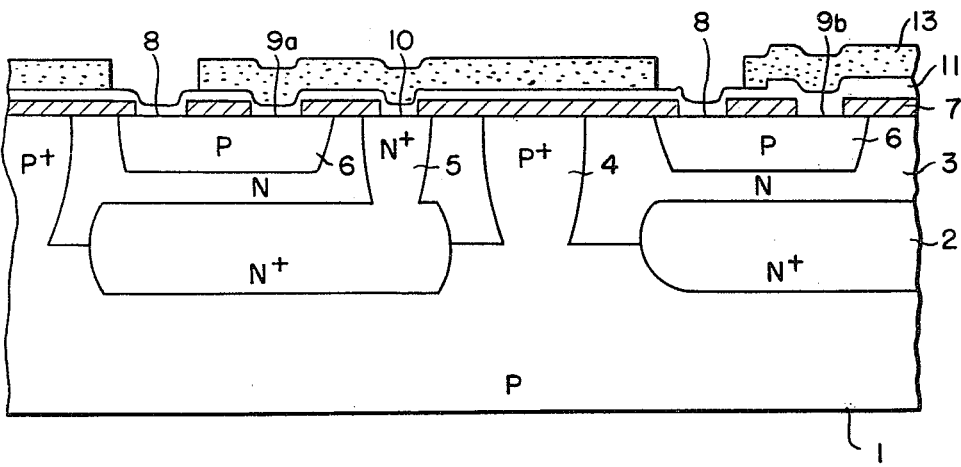
Figure 4:
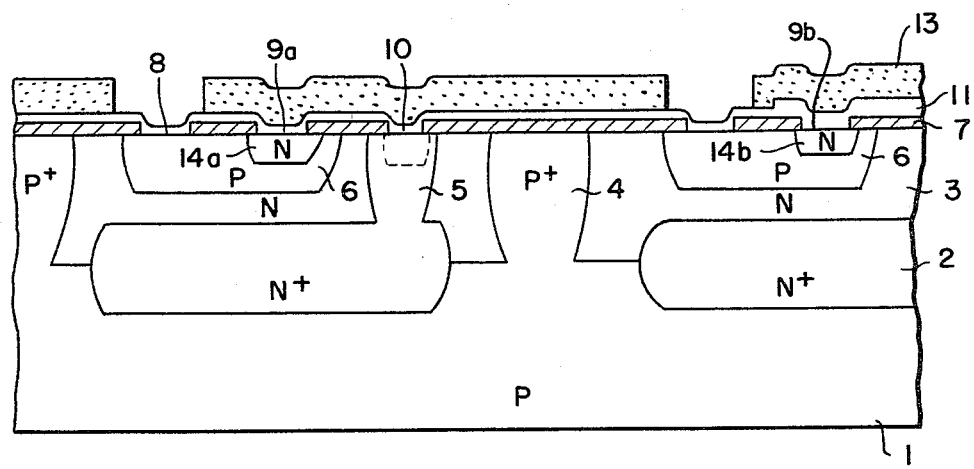
Figure 5:
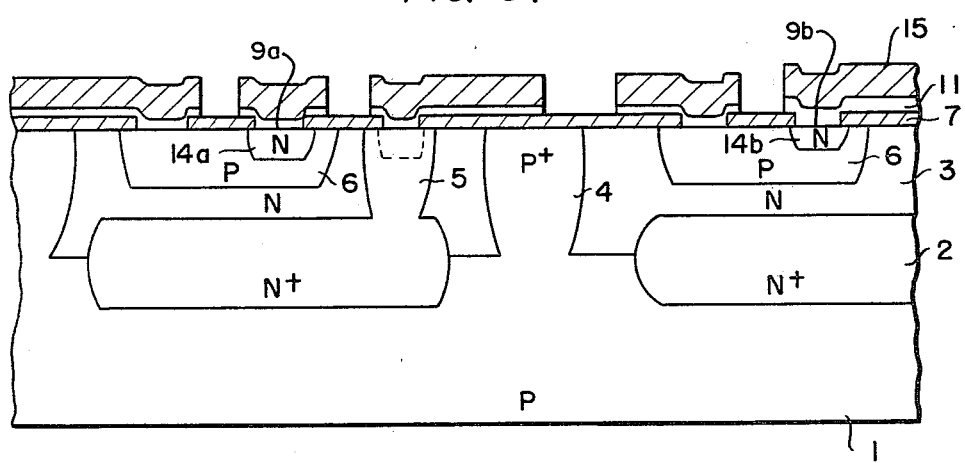

Subsequently, the substrate 1 is placed in a reduced pressure vapor growth apparatus in order to achieve the growth of a phospho-silicate glass layer (PSG) 13 shown in FIG. 3. The reaction gases used are monosilane ($SiH_4$), phosphine ($PH_3$) and oxygen ($O_2$). The flow rate of phosphine is 40% of the total flow rate of the $SiH_4$ and $PH_3$. For the growth of PSG, the substrate 1 is heated up to 400° C. and the vapor growth is continued for 20 minutes. Thereby the PSG layer 13 of 5000 Å (500 nm) thickness is obtained. In addition, in FIG. 3, the PSG layer 13 is removed at least at the base electrode windows 8 but covers the emitter electrode windows 9a and 9b and the collector electrode windows 10.

Next, a thermal process is performed for achieving the emitter diffusion. This thermal process is continued for four (4) minutes at the elevated temperature of 1100° C. During this thermal process, the phosphorus in the PSG 13 diffuses through the polycrystalline silicon layer 11 in accordance with the selectively different thicknesses thereof and then diffuses into the silicon substrate 1, thus forming the emitter regions 14a and 14b indicated in FIG. 4. During this thermal process, the impurity in the base region 6 diffuses into the undoped polycrystalline silicon layer 11, rendering that portion of the polycrystalline silicon layer 11 contained in the base electrode window 8 conductive. Here, it is recommended for this purpose to previously diffuse a P type impurity into the base region 6 under the base electrode window 8. The resistivity of the portion of the polycrystalline silicon layer 11 within the emitter electrode window 9 and the collector electrode window 10 is lowered by the diffusion of phosphorus dopants from the PSG layer 13. The phosphorus-doped polycrystalline silicon layer is of 4000 Å (400 nm) thickness and has a sheet resistivity of about 50Ω/square, for the case in which it is formed by the CVD method; and it is superior because the sheet resistivity can be lowered to from 20 to 30Ω/square by means of the diffusion of phosphorus. The diffusion through the polycrystalline silicon layer 11 has another merit that the accuracy of the diffusion can be improved. Namely, the accuracy of the diffusion depth or concentration can be improved up to an accuracy of ±10%, whereas the accuracy is only about ±20% in the case of the diffusion of the doped polysilicon.

After the diffusion of phosphorus, the silicon substrate 1 is dipped into a hydrophosphoric acid system etching solution and thereby the PSG layer 13 is perfectly removed.

Subsequently, the aluminum layer 15 is evaporated onto the entire surface in a uniform thickness of about 1.0 μm as the electrode wiring material. Then, the aluminum layer is selectively etched to retain desired wiring leads by photolithography and then the polycrystalline silicon layer 11 which is not under the aluminum wiring leads is removed by a nitric acid ethcing solution. The resulting structure is shown in the cross-sectional view of FIG. 5.

In the sintering of the resultant aluminum leads, since the polycrystalline silicon layer material exists under the aluminum, the aluminum does not penetrate down to the silicon substrate, even when the aluminum and the polycrystal silicon are alloyed, and thus the semiconductor junctions in the silicon substrate are protected from breakdown.

For the comparatively shallow emitter region 14b, the comparatively thick polycrystalline silicon 11 exists, preventing the junction from breakdown during sintering.

The transistor thus obtained has the following characteristics. The transistor Ta having the deep emitter region 14a and the transistor Tb having the shallow emitter region 14b are formed by the base diffusion method and exhibit the same collector-base breakdown voltage of 40 V. However, in the case of the transistor Ta, the current amplification factor is adjusted to 100 and $V_{CEO}$ is 7 V. In the case of the transistor Tb, the current amplification factor is 30 and $V_{CEO}$ is 14 V. For this reason, the latter transistor Ta is used as the transistor to be used for the input interface circuit. The embodiment mentioned above can also be executed in the same way even in case the conductivity types of respective regions are inverted.

In the embodiments of FIGS. 1 to 5 the emitter regions of the transistors Ta and Tb are respectively of greater and lesser depths, even though formed by the single diffusion process; in the same way, the depths of the respective base regions, can also be different, even though formed by the single diffusion. Thereby, the base diffusion process of the junction breakdown type programmable read only memory (PROM) is simplified. The PROM of this type is required to have sufficient collector-emitter withstand voltage in the transistor-like structures, comprising the programmable cells in view of the relatively higher voltage applied to them on the occasion of programming, or writing, into the memory cells; moreover, a parasitic PNPN thyristor structure may be established between the adjacent cells. Therefore, it is required to keep the current amplification factor of the parasitic PNPN thyristor small; accordingly the base region in the cell must be deep as compared with those employed in the peripheral circuit. The present invention thus can be applied to a PROM having such different base depth requirements for the cell transistors versus those of the peripheral circuit.

We claim:

1. A method of manufacturing a semiconductor device comprising the steps of:
   forming an insulating film on a selected surface of a semiconductor substrate, said film having a plurality of diffusion windows through which corresponding portions of said selected surface of the semiconductor substrate are exposed,
   forming polycrystalline semiconductor layers of selectively different thicknesses on predetermined ones of said surface portions of said semiconductor substrate exposed through said plurality of diffusion windows, and
   simultaneously forming diffusions regions of different junction depths in the respective portions of said semiconductor substrate associated with said exposed surface portions thereof on which said polycrystalline semiconductor layers of different thicknesses are formed by diffusing impurities into said substrate through said polycrystalline semiconductor layers of different thicknesses and the said corresponding portions of said substrate into said respective portions of said semiconductor substrate.

2. A method of manufacturing a semiconductor device comprising the steps of:
   defining a selected surface of a semiconductor substrate on which a semiconductor device is to be formed, p1 forming an insulating film on said selected surface of said semiconductor substrate having a plurality of diffusion windows through which corresponding portions of the said selected surface of the semiconductor substrate are exposed,
   applying a polycrystalline semiconductor layer on said insulating film and extending through said diffusion windows thereof to contact the said corresponding portions of the surface of the semiconductor substrate,
   applying a protective mask selectively over portions of said polycrystalline semiconductor layer associated with predetermined said diffusion windows with respect to which regions of a first junction depth are to be formed, the remainder of said polycrystalline silicon layer being exposed at least as to the portions thereof extending through other of said diffusion windows with respect to which diffusion junctions of a second junction depth deeper than said first junction depth are to be formed,
   reducing the thickness of said polycrystalline semiconductor layer in the exposed portion thereof,
   removing said protective mask, and
   simultaneously forming said diffusion regions of both said first and said second junction depths by diffusing impurities through said polycrystalline semiconductor layers of said first and second depths, associated with said diffusion windows, and into the corresponding said substrate portions.

3. The method of claim 2 wherein said step of selectively removing exposed portions of said polycrystalline semiconductor layer comprises oxidizing the said exposed portion of said polycrystalline semiconductor layer not covered by said protective layer, for converting a predetermined amount thereof to an oxide while retaining a desired, remaining thickness of unconverted polycrystalline semiconductor material, and removing the semiconductor oxide material by an oxide-selective etchant.

4. A method of manufacturing a semiconductor device as claimed in claims 1 or 2, further comprising the step of depositing a diffusion source including a doping impurity to be diffused into said substrate on the surface of said polycrystalline semiconductor layer remote from said selected surface of said substrate.

5. A method of manufacturing a semiconductor device as claimed in claim 2 wherein said diffusion source is a glass film including impurities.

6. A method of manufacturing a semiconductor device as claimed in claim 1 wherein said impurity diffusion is performed by a gas diffusion method.

7. A method of manufacturing a semiconductor device as claimed in claims 1 or 2 wherein the step of diffusing impurities is performed by an ion-implantation method.

8. A method of manufacturing a semiconductor device as claimed in claim 7 wherein said diffused regions comprise emitter regions.

9. A method of manufacturing a semiconductor device as claimed in claims 1 or 2 further comprising forming an electrode wiring material on said polycrystalline semiconductor layer and selectively removing portions thereof, the remaining portions of said wiring material providing contacts to said diffusion regions.

* * * * *

UNITED STATES PATENT AND TRADEMARK OFFICE
CERTIFICATE OF CORRECTION

PATENT NO. : 4,375,999

DATED : March 8, 1983

INVENTOR(S) : Nawata et al.

It is certified that error appears in the above-identified patent and that said Letters Patent is hereby corrected as shown below:

Column 2, line 53, after "still" insert --a--;
line 58, "surfaces" should be --surface--.
Column 3, line 15, after "where" insert --a--;
line 21, "of" should be --or--;
line 27, "method" should be --methods--;
Column 4, line 12, after "memory" insert --,--;
line 49, after "toward" insert -- -- --;
line 50, after "approaches" insert -- -- --;
line 62, after "stages" insert --,--.
Column 5, line 11, after "and" insert --a--;
line 53, "hat" should be --hot--;
line 64, after "of" insert --the--.
Column 6, line 14, after "8" insert --,--;
line 59, "ethcing" should be --etching--;
line 63, after "the" insert --remaining--.
Column 7, line 14, "Ta" should be --Tb--;
line 56, diffusions" should be --diffusion--.
Column 8, line 3, delete "pl" [should be the start of a new ¶];
line 49, "2" should be --4--.

Signed and Sealed this

Fifteenth Day of November 1983

[SEAL]

Attest:

GERALD J. MOSSINGHOFF

Attesting Officer    Commissioner of Patents and Trademarks